United States Patent
Tu et al.

(12) 
(10) Patent No.: US 6,849,546 B1
(45) Date of Patent: Feb. 1, 2005

(54) METHOD FOR IMPROVING INTERLEVEL DIELECTRIC GAP FILLING OVER SEMICONDUCTOR STRUCTURES HAVING HIGH ASPECT RATIOS

(75) Inventors: An-Chun Tu, Taipei (TW); Chen-Ming Huang, Hsin-Chu (TW)

(73) Assignee: Taiwan Semiconductor Manufacturing Co. (TW)

( * ) Notice: Subject to any disclaimer, the term of this patent is extended or adjusted under 35 U.S.C. 154(b) by 0 days.

(21) Appl. No.: 10/700,779

(22) Filed: Nov. 4, 2003

(51) Int. Cl.⁷ .............................................. H01L 21/44
(52) U.S. Cl. ...................................... 438/682; 438/197
(58) Field of Search ................................. 438/682, 681, 438/683, 684, 197, 680, 276, 668, 649, 650, 651, 655, 656, 657, 510, 514, 300, 301, 303, 304, 311, 733, 721, 755, 914, 954

(56) References Cited

U.S. PATENT DOCUMENTS

| | | |
|---|---|---|
| 4,994,404 A | 2/1991 | Sheng et al. .................. 437/44 |
| 5,751,040 A | 5/1998 | Chen et al. .................. 257/332 |
| 6,252,277 B1 * | 6/2001 | Chan et al. .................. 257/330 |
| 6,365,943 B1 | 4/2002 | Gardner et al. .............. 257/377 |
| 6,380,535 B1 | 4/2002 | Wetzel et al. .......... 250/227.14 |
| 6,455,373 B1 | 9/2002 | Pham et al. ................. 438/257 |
| 6,583,012 B1 * | 6/2003 | Buynoski et al. ........... 438/275 |

* cited by examiner

*Primary Examiner*—David Nhu
(74) *Attorney, Agent, or Firm*—Duane Morris LLP

(57) ABSTRACT

A novel sequence of process steps is provided for forming void-free interlevel dielectric layers between closely spaced gate electrodes. Closely spaced gate electrodes having sidewall spacers are formed on a substrate. After using the sidewall spacers to form self-aligned source/drain contacts and self-aligned silicide contacts, the sidewall spacers are removed. By removing the sidewall spacers, the aspect ratio of the gap between adjacent closely spaced gate electrodes is substantially reduced (from greater than 5 to less than 2), thereby preventing voids during the subsequent deposition of an ILD layer.

30 Claims, 2 Drawing Sheets

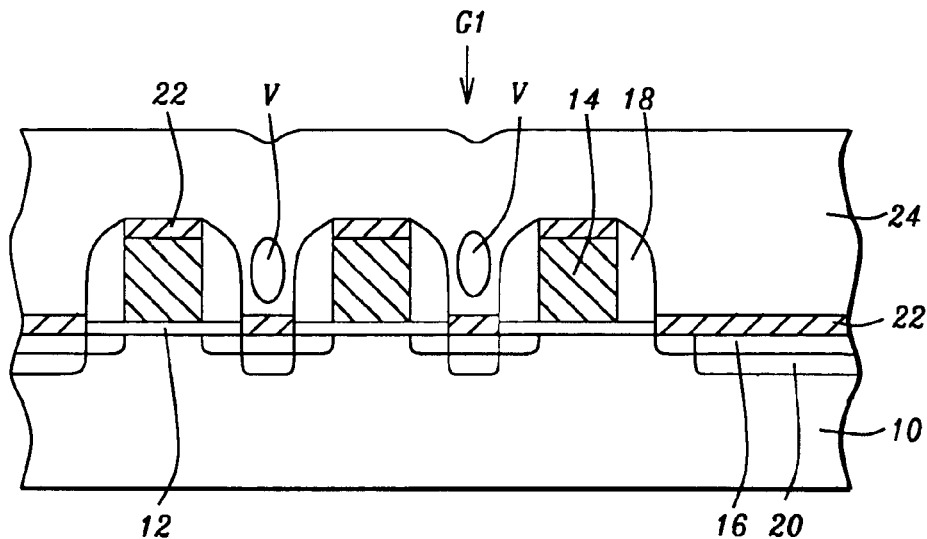
FIG. 1 – Prior Art
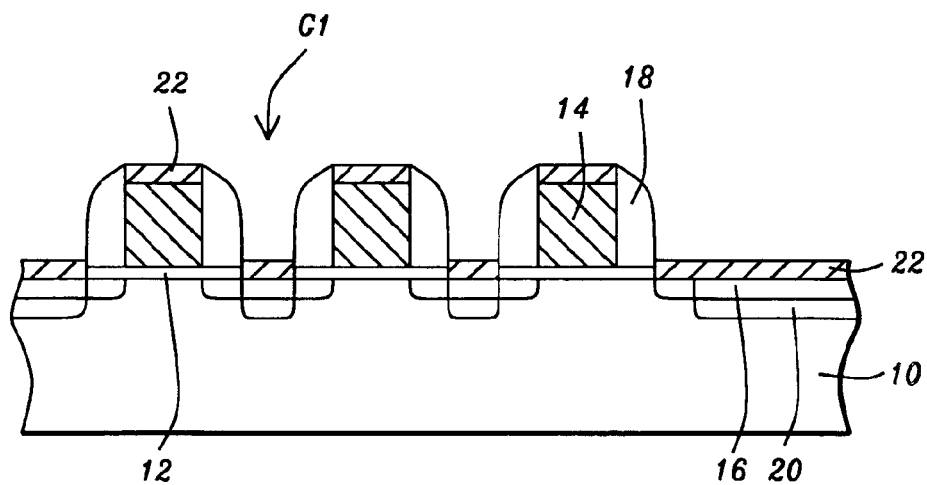
FIG. 2

METHOD FOR IMPROVING INTERLEVEL DIELECTRIC GAP FILLING OVER SEMICONDUCTOR STRUCTURES HAVING HIGH ASPECT RATIOS

BACKGROUND OF THE INVENTION (1) Field of the Invention

The present invention relates to a method for making integrated circuits on semiconductor substrates. The method is for forming interlevel dielectric (ILD) layers having improved gap filling between closely spaced conducting lines. In particular the method utilizes the removal of sidewall spacers on closely spaced FET gate electrodes after forming self-aligned lightly doped source/drain areas and source/drain contact areas, and before depositing an ILD layer.

(2) Description of the Prior Art

As the Ultra-Large Scale Integration (ULSI) circuit density increases and device features sizes become less than 0.25 micrometers, increasing numbers of patterned electrically conducting levels are required with decreasing spacings between conducting lines at each level to effectively wire up discrete semiconductor devices on semiconductor chips. In the more conventional method the different levels of electrical interconnections are separated by layers of insulating material. These interposed insulating layers have etched via holes which are used to connect one conducting level to the next. A typical insulating material is silicon oxide ($SiO_2$). More recently, however, dielectrics having a low dielectric constant k have been used, for example, values less than 4.0 are typically used to reduce the RC constant and thereby improve circuit performance. However, as the device dimensions decrease and the packing density increases, it is necessary to reduce the spacings (gaps) between the conducting lines to effectively wire up the discrete devices on a silicon substrate. Unfortunately, one level of interconnections where this is a particular problem is at the first level of polysilicon interconnections used to make FET gate electrodes and some of the local interconnections. As the spacings between the gate electrodes decreases, it is also necessary to retain the thickness of the polysilicon lines to maintain a reasonably low line resistance (sheet resistance) to achieve a low RC constant. Unfortunately, this results in a very high aspect ratio (height to width) for the gap or space between the lines. This increased aspect ratio makes it difficult to fill the gaps when the next level of insulation is deposited without forming unwanted voids, as shown in FIG. 1. This problem is best understood with reference to FIG. 1, in which a gate oxide 12 is grown on device areas on the surface of a substrate 10. Closely spaced gate electrodes 14 are formed next by depositing a polysilicon layer which is patterned. Then lightly doped source/drain regions 16 are implanted adjacent to the gate electrodes 14 (self-aligned). Sidewall spacers 18 are formed on the gate electrodes and source/drain (S/D) contact regions 20 are implanted self-aligned to the sidewall spacers. To improve the conductivity of the gate electrodes and to provide good ohmic contact to the S/D contacts, a metal, such as cobalt (Co) is deposited and annealed to form a self-aligned silicide 22 on the gate electrodes 14 and on the contacts 20. In the current semiconductor technologies the spacings or gaps between gate electrodes are quite narrow, and to retain reasonable conductivity the height (thickness) of the gate electrodes cannot be significantly reduced. After forming the sidewall spacers the aspect ratio of the gaps G, (ratio of the height of the polysilicon to the width between the sidewall spacers) can be quite large, for example, greater than 5.0. When an interlevel dielectric (ILD) insulating layer 24 is deposited, voids V are inadvertently formed in the ILD layer in the gaps G1 between the gate electrodes due to the nature of the deposition process. Typically these voids extend along the gate electrodes and local interconnections and can lead to electrical shorts when via holes are etched in the ILD layer. Therefore, there is a strong need in the semiconductor industry to eliminate these voids during ILD deposition.

Several methods for forming closely spaced conducting lines for high-density circuits have been described. For example, U.S. Pat. No. 5,751,040 to Chen et al. describes a method for forming vertical FETs for ROM memory cells in which a source is formed in a trench, an FET channel is formed in the trench wall, and a drain on the surface which are self-aligned. This allows the inventors to double the density of the FETs. Sheng et al. in U.S. Pat. No. 4,994,404 use a disposable amorphous carbon sidewall spacer to self-align the source/drain contacts to the LDD. The amorphous carbon is then removed. Gardner et al. in U.S. Pat. No. 6,365,943 B1 describe a method for making two levels of FET devices to increase circuit density on the chip. U.S. Pat. No. 6,380,535 B1 to Wu et al. describe a method for making sidewall spacers on an FET gate electrode without damaging the substrate during etching. Pham et al., U.S. Pat. No. 6,455,373 B1, make flash memory (floating gate) FETs in which the sidewalls are of different thicknesses on the source and drain sides to reduce leakage currents, such ion charge and the like.

SUMMARY OF THE INVENTION

A principal object of the present invention is to form conformal interlevel dielectric (ILD) layers having reduced voids (W-stringers) in the gaps between closely spaced conducting lines having sidewall spacers.

A second objective of this invention is to reduce the aspect ratio of the gaps between these closely spaced conducting lines by removing the sidewall spacers or partially removing the sidewall spacers after forming the lightly doped source/drain areas and before depositing the ILD layers.

In accordance with the objects of this invention, a new method is achieved for depositing an ILD layer with reduced void formation over closely spaced conducting lines, and more specifically for reducing voids between FET gate electrodes. The method begins by providing a semiconductor substrate, such as a single-crystal silicon substrate with active device areas having on the surface a gate oxide. A doped polysilicon layer is deposited and patterned to form polysilicon gate electrodes. Lightly doped source/drain regions are formed adjacent to and self-aligned to the polysilicon gate electrodes, for example, by ion implantation. Next, a conformal insulating layer, such as silicon oxide ($SiO_2$) and/or silicon nitride ($Si_3N_4$), is deposited and anisotropically etched back to form sidewall spacers on the polysilicon gate electrodes. Source/drain contact areas are then formed adjacent to the sidewall spacers by using a second ion implantation. A self-aligned metal silicide (SALICIDE) layer is formed on the polysilicon gate electrodes and on the source/drain contact areas. The SALICIDE is formed by depositing a metal, such as cobalt (Co), on the exposed polysilicon gate electrodes and on the source/drain contact areas and annealing to form CoSi. Then the unreacted Co on the insulating surfaces is removed. In the conventional process for very-high density circuits with minimal feature sizes, the aspect ratio of the gaps between the gate electrodes having sidewall spacers can be very large (for example, greater than 5), and result in void formation during subsequent ILD layer deposition. A novel feature of this invention is to remove the sidewall spacers, which reduces the aspect ratio of the gaps between the gate electrodes. The SALICIDE contacts on the gate electrodes and on the source/drain contact areas are retained to provide low contact resistance during subsequent processing. An interlevel dielectric layer is deposited over and between the polysilicon gate electrodes and filling the gaps between the polysilicon gate electrodes on the substrate. Because of the reduced aspect ratio of the gaps, the ILD layer can be deposited with reduced voids in the ILD between the gate electrodes.

BRIEF DESCRIPTION OF THE DRAWINGS

The objectives and other advantages of this invention are best understood with reference to the preferred embodiment and the drawings in the figures.

FIG. 1 is a schematic cross-sectional view showing several closely spaced gate electrodes formed using conventional processing in which the high-aspect ratio between the electrodes results in unwanted voids that occur in an interlevel dielectric layer deposited on the gate electrodes.

FIGS. 2 through 4 are schematic cross-sectional views showing the sequence of process steps for making closely spaced gate electrodes having substantially reduced aspect ratio between the electrodes resulting in improved ILD layer deposition without voids, by the method of this invention.

DESCRIPTION OF THE PREFERRED EMBODIMENT

Figure 3:
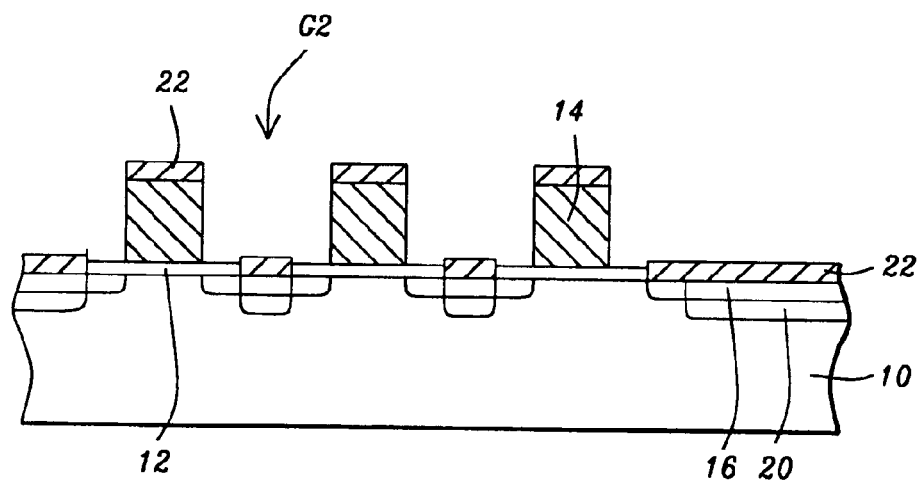

The method of this invention for forming an interlevel dielectric layer on closely spaced FET gate electrodes (including local interconnections) with high-aspect ratios is now described. While the method is described for depositing an ILD layer having reduced voids over closely spaced FET gate electrodes, it should be understood by those skilled in the art that the method can also be used for closely spaced conducting lines where self-aligned implants and self-aligned silicides are required. For example, the method can be used for closely spaced bit lines and the like. It should also be understood that the method is applicable to CMOS circuits having both N-channel and P-channel FETs.

Referring now to FIG. 2, the method begins by providing a semiconductor substrate 10. Typically the substrate is a single-crystal silicon having a <100> crystallographic orientation. Active device areas are formed in and on the substrate 10, one of which is shown in FIG. 2. A gate oxide, 12 is formed on the active device areas. Typically the gate, oxide 12 is a silicon oxide formed by thermal oxidation to a thickness of between about 16 and 26 Angstroms. For example, the thicker gate oxide (26 Angstroms) would be used for technologies having feature sizes of about 0.15 um, and the thinner oxides would apply to technologies having features sizes of about 0.09 um. However, other advanced dielectric layers having higher dielectric constants k, such as silicon oxynitride and the like, can also be used for the gate oxide 12 without limiting the scope of the invention. A doped polysilicon layer is deposited, for example, by chemical-vapor deposition (CVD) to a thickness of between about 1500 and 1800 Angstroms. Using conventional photolithographic techniques and anisotropic plasma etching, the polysilicon layer is patterned to form closely spaced polysilicon lines that extend over the active device regions to form gate electrodes 14 having a width of about 100 nanometers (nm). The gate electrodes also extend over shallow trench regions (not shown) to provide some of the local interconnections. For current high-density integrated circuits the spacing between gate electrodes is typically about 180 nm. A first ion implantation is used to form lightly doped source/drain regions 16 adjacent to and self-aligned to the polysilicon gate electrodes 14.

Still referring to FIG. 2, a conformal insulating layer, preferably silicon nitride ($Si_3N_4$), is deposited. The $Si_3N_4$ can be deposited by CVD using silane ($SiH_4$) and ammonia ($NH_3$) as the reactant gas mixture. The insulating layer is formed to a preferred thickness of between about 800 and 1000 Angstroms. The insulating layer is anisotropically etched back to form sidewall spacers 18 on the sides of the polysilicon gate electrodes 14. For a spacing of about 180 nm between adjacent gate electrodes, the sidewall spacers are formed to have a width of about 75 nm. Source/drain contact areas 20 are then formed adjacent to the sidewall spacers 18 by using a second ion implantation. The resulting gap G1 has a high aspect ratio of about 180 nm/(180 nm−75×2 nm), which has a value of 6.0.

Continuing with FIG. 2, a self-aligned metal silicide (SALICIDE) layer 22 is formed on the polysilicon gate electrodes 14 and on the source/drain contact areas 20. The SALICIDE is formed by depositing a metal, such as cobalt (Co), nickel (Ni), and titanium (Ti), on the exposed polysilicon gate electrodes 14 and on the source/drain contact areas 20 and annealing to form CoSi. The SALICIDE layer is formed to a thickness of between about 250 and 400 Angstroms. Then the unreacted Co on the insulating surfaces (not shown) is removed. As described in detail above, in the conventional process for very-high density circuits with minimal feature sizes, the aspect ratio of the spacings or gaps G1 between the gate electrodes having sidewall spacers can be very large (for example, greater than 5). As shown in the prior-art in FIG. 1, these high aspect ratio gaps can result in void formation V during subsequent ILD layer deposition 24.

Referring to FIG. 3, a novel feature of this invention is to remove the sidewall spacers 18, which increases the spacings or gaps the FED gate electrodes, thereby reducing the aspect ratio of the spacing or gaps, labeled G2. For example, the aspect ratio can be reduced from 5.0 to less than 1.5 or about 1.4. The $Si_3N_4$ sidewall spacers 18 are selectively removed preferably using a hot $H_3PO_4$ etch. Alternatively the sidewall spacers can be removed using in-situ plasma etching in a high-density plasma (HDP) etcher. After removing the sidewall spacers 18, the remaining CoSi 22 on the gate electrodes 14 and on the source/drain contact areas 20 is retained to provide low contact resistance during subsequent processing.

Figure 4:
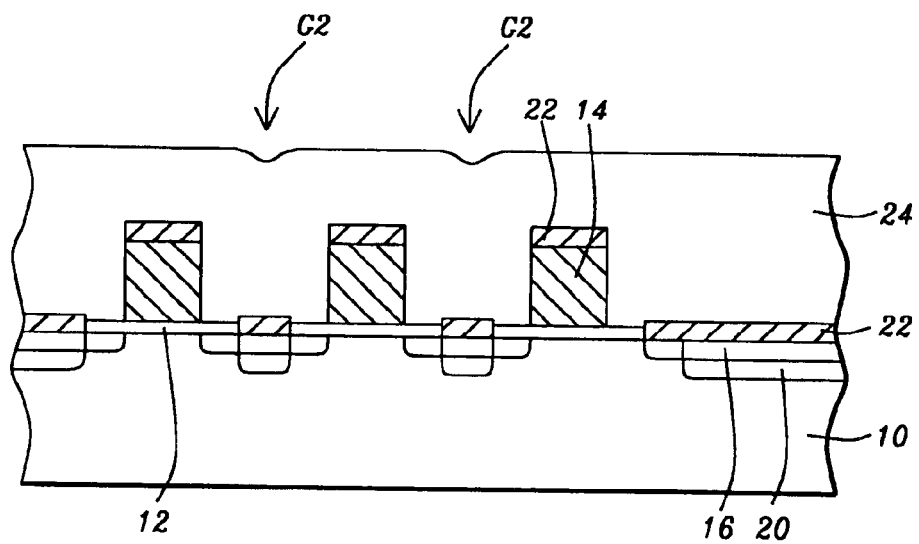

Referring to FIG. 4, an interlevel dielectric layer 24 is deposited over and between the polysilicon gate electrodes 14 and filling the gaps G2 between the polysilicon gate electrodes on the substrate. Preferably the ILD layer 24 is composed of a thin plasma-enhanced-deposited $Si_3N_4$ layer (not shown) that serves as a diffusion barrier layer, and a thicker phosphorus-doped silicate glass (PSG) that is deposited, for example, by high-density-plasma CVD. The $Si_3N_4$ barrier layer is deposited to a preferred thickness of about 600 Angstroms, and the PSG layer is deposited to a preferred thickness of about 9500 Angstroms. Because of the reduced aspect ratio of the gaps G2, the ILD layer 24 can be deposited without forming voids (labeled V as depicted in the prior-art FIG. 1) in the ILD layer 24 in the gaps G2 between the gate electrodes 14.

While the invention has been particularly shown and described with reference to the preferred embodiment thereof, it will be understood by those skilled in the art that various changes in form and details may be made without departing from the spirit and scope of the invention.

What is claimed is:

1. A method for forming an interlevel dielectric (ILD) layer with improved gap filling comprising the steps of:

providing a semiconductor substrate having closely spaced gate electrodes, wherein said closely spaced gate electrodes defining gaps therebetween;

forming sidewall spacers on said gate electrodes;

forming source/drain contact areas adjacent to said sidewall spacers;

forming a metal silicide layer on said gate electrodes and on said source/drain contact areas;

removing said sidewall spacers; and forming said interlevel dielectric layer over and between said gate electrodes and filling gaps between said gate electrodes on said substrate, wherein said removal of the sidewall spacers result in an aspect ratio of said gaps of less than 1.5.

2. The method of claim 1, wherein said closely spaced gate electrodes are formed from a polysilicon layer deposited to a thickness of between about 1500 and 1800 Angstroms.

3. The method of claim 1, wherein said substrate includes lightly doped source and drain regions adjacent to said closely spaced gate electrodes and wherein said lightly doped source and drain regions are formed by ion implanting an N type dopant for N-channel devices and ion implanting a P type dopant for P-channel devises.

4. The method of claim 1, wherein said sidewall spacers a formed by depositing a conformal chemical-vapor deposited insulating layer and anisotropically etching back to said semiconductor substrate.

5. The method of claim 1, wherein said source/drain contact areas are formed by ion implanting an $N^+$ type dopant for N-channel devices and ion implanting a $P^+$ type dopant for P-channel devices.

6. The method of claim 1, wherein said metal silicide layer is formed on said gate electrodes and on said source/drain contact areas using a salicide process that uses a metal selected from the group that includes cobalt, nickel, and titanium.

7. The method of claim 1, wherein said metal silicide layer is formed to a thickness of between about 250 and 400 Angstroms.

8. The method of claim 1, wherein said sidewall spacers are silicon nitride and are completely removed using a hot phosphoric acid solution ($H_3PO_4$).

9. The method of claim 1, wherein said sidewall spacers are silicon oxide, and are completely removed using in-situ plasma etching in a high-density plasma etcher.

10. The method of claim 1, which said interlevel dielectric layer is a phosphorus-doped silicon oxide deposited by chemical-vapor deposition to a thickness of at least about 9500 Angstroms.

11. The method of claim 1, wherein said interlevel dielectric layer includes a silicon nitride barrier layer having a thickness of about 600 Angstroms.

12. The method of claim 1, wherein said interlevel dielectric alyer is a dielectric material having a low-dielectric constant.

13. A method for forming an interlevel dielectric (ILD) layer with improved gap filling comprising the steps of:

providing a semiconductor substrate having closely spaced polysilicon gate electrodes, wherein said closely spaced gate electrodes defining gas therebetween;

forming lightly doped source and drain regions adjacent to said polysilicon gate electrodes;

forming sidewall spacers on said polysilicon gate electrodes;

forming source/drain contact areas adjacent to said sidewall spacers;

forming a self-aligned metal silicide layer on said polysilicon gate electrodes and on said source/drain contact areas;

partially removing said sidewall spacers; and forming said interlevel dielectric layer over and between said polysilicon gate electrodes and filling gaps between said polysilicon gate electrodes on said substrate, wherein said removal of the sidewall spacers result in an aspect ratio of said gaps of less than 1.5.

14. The method of claim 13, wherein said closely spaced polysilicon gate electrodes are formed from a polysilicon layer deposited to a thickness of between about 1500 and 1800 Angstroms.

15. The method of claim 13, wherein said lightly doped source and drain regions are formed by ion implanting an N type dopant for N-channel devices and ion implanting a P type dopant for P-channel devices.

16. The method of claim 13, wherein said sidewall spacers are formed by deposit a conformal chemical-vapor deposited insulating layer and anisotropically etching back to said semiconductor substrate.

17. The method of claim 13, wherein said source/drain contact areas are formed by ion implanting an $N^+$ type dopant for N-channel devices and ion implanting a $P^+$ type dopant for P-channel devices.

18. The method of claim 13, wherein said self-aligned metal silicide layer is formed on said polysilicon gate electrodes and on said source/drain contact areas using a salicide process that uses a metal selected from the group that includes cobalt, nickel, and titanium.

19. The method of claim 13, wherein said metal silicide layer is formed to a thickness of between about 250 and 400 Angstroms.

20. The method of claim 13, wherein said sidewall spacers are silicon nitride and are removed using a hot phosphoric acid solution ($H_3PO_4$).

21. The method of claim 13, wherein said sidewall spacers are silicon oxide, and are removed using in-situ plasma etching in a high-density plasma etcher.

22. The method of claim 13, wherein said interlevel dielectric layer is a phosphorus-doped silicon oxide deposited by chemical-vapor deposition to a thickness of at least about 9500 Angstroms.

23. The method of claim 13, wherein said interlevel dielectric layer includes a silicion nitride barrier layer having a thickness of about 600 Angstroms.

24. The method of claim 13, wherein said interlevel dielectric layer is a dielectric material having a low-dielectric constant.

25. The method of claim 1, wherein the aspect ratio of said gaps is about 1.4.

26. The method of claim 1, wherein said sidewall spacers are partially removed.

27. The method of claim 1, wherein said sidewall spacers are completely removed.

28. The method of claim 13, wherein the aspect ratio of said gaps is about 1.4.

29. The method of claim 13, wherein said sidewall spacers are partially removed.

30. The method of claim 13, wherein said sidewall spacers are completely removed.

* * * * *

UNITED STATES PATENT AND TRADEMARK OFFICE
CERTIFICATE OF CORRECTION

PATENT NO. : 6,849,546 B1 Page 1 of 1
DATED : February 1, 2005
INVENTOR(S) : Tu et al.

It is certified that error appears in the above-identified patent and that said Letters Patent is hereby corrected as shown below:

<u>Column 5,</u>
Line 28, delete "devises" and insert -- devices --.
Line 29, delete "a" and insert -- are --.
Line 63, delete "gas" and insert -- gaps --.

<u>Column 6,</u>
Line 48, delete "silicion" and insert -- silicon --.

Signed and Sealed this

Sixteenth Day of May, 2006

JON W. DUDAS
*Director of the United States Patent and Trademark Office*